United States Patent
Khalid

(10) Patent No.: US 9,279,947 B2
(45) Date of Patent: Mar. 8, 2016

(54) METHODS AND APPARATUS FOR HIGH SPEED SHORT DISTANCE OPTICAL COMMUNICATIONS USING MICRO LIGHT EMITTING DIODES

(71) Applicant: 4233999 Canada Inc., Westmount (CA)

(72) Inventor: Najeeb Ashraf Khalid, Westmount (CA)

(73) Assignee: 4233999 CANADA INC., Westmount, QC (CA)

( * ) Notice: Subject to any disclaimer, the term of this patent is extended or adjusted under 35 U.S.C. 154(b) by 0 days.

(21) Appl. No.: 14/385,642

(22) PCT Filed: Oct. 10, 2013

(86) PCT No.: PCT/CA2013/050763
§ 371 (c)(1),
(2) Date: Sep. 16, 2014

(87) PCT Pub. No.: WO2014/075178
PCT Pub. Date: May 22, 2014

(65) Prior Publication Data
US 2015/0241645 A1    Aug. 27, 2015

Related U.S. Application Data

(60) Provisional application No. 61/727,014, filed on Nov. 15, 2012.

(51) Int. Cl.
*G02B 6/42* (2006.01)
*H04B 10/2581* (2013.01)
*H04B 10/50* (2013.01)
*H01L 25/075* (2006.01)
*H01L 31/103* (2006.01)
*H01L 33/48* (2010.01)
*H01L 33/58* (2010.01)
*H01L 33/62* (2010.01)

(52) U.S. Cl.
CPC .......... *G02B 6/4202* (2013.01); *G02B 6/4203* (2013.01); *G02B 6/4246* (2013.01); *H01L 25/0753* (2013.01); *H01L 31/1035* (2013.01); *H01L 33/486* (2013.01); *H01L 33/58* (2013.01); *H01L 33/62* (2013.01); *H04B 10/2581* (2013.01); *H04B 10/502* (2013.01); *G02B 6/4249* (2013.01); *G02B 6/4281* (2013.01); *G02B 6/4292* (2013.01)

(58) Field of Classification Search
None
See application file for complete search history.

(56) References Cited

U.S. PATENT DOCUMENTS 5,357,590 A * 10/1994 Auracher ............... 385/33
6,328,482 B1 * 12/2001 Jian ....................... 385/88
(Continued)

FOREIGN PATENT DOCUMENTS

WO    WO 2013/121051 A1    8/2013

OTHER PUBLICATIONS

PCT/CA2013/050763 International Search report.
(Continued)

*Primary Examiner* — Tina Wong
(74) *Attorney, Agent, or Firm* — Anglehart et al.

(57) ABSTRACT

The method disclosed provides communication over short distances at high speed via fiber optics making it practical to replace standard copper conductors with optical fiber. This is a solution to the "last mile" problem in Internet high speed communications.

17 Claims, 6 Drawing Sheets

(56) References Cited

U.S. PATENT DOCUMENTS

| | | |
|---|---|---|
| 6,942,396 B2 * | 9/2005 | Marion et al. .................. 385/90 |
| 7,031,578 B2 * | 4/2006 | Marion et al. .................. 385/52 |
| 7,440,701 B2 | 10/2008 | Li et al. |
| 7,645,076 B2 * | 1/2010 | Martini et al. .................. 385/88 |
| 2007/0031089 A1 | 2/2007 | Tessnow et al. |
| 2008/0212964 A1 | 9/2008 | Gao et al. |
| 2009/0136237 A1 * | 5/2009 | Martini et al. ................ 398/141 |

OTHER PUBLICATIONS

PCT/CA2013/050763 written opinion.

* cited by examiner

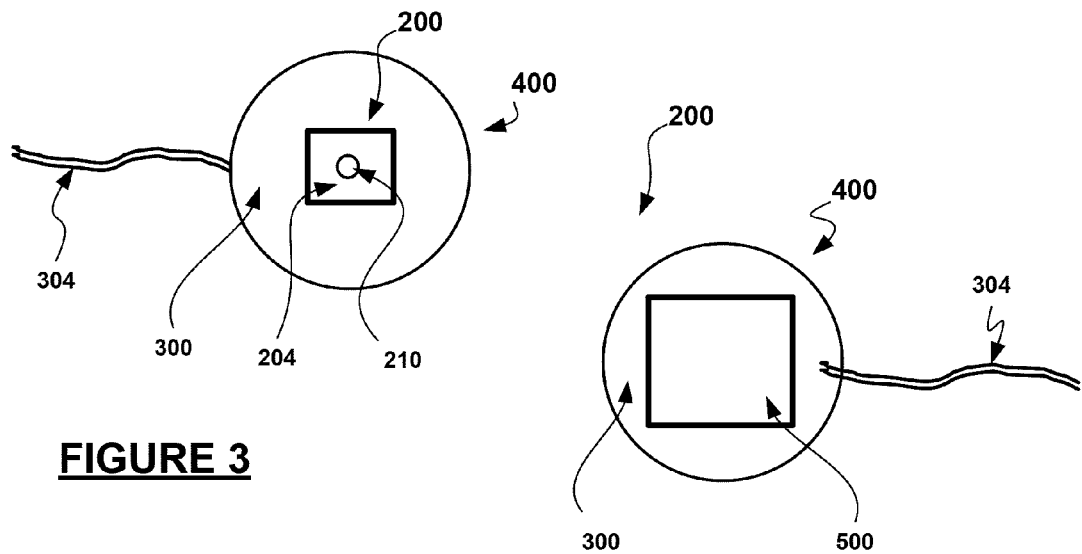
FIGURE 3
FIGURE 4
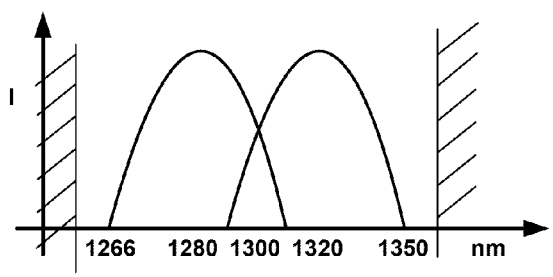
FIGURE 6
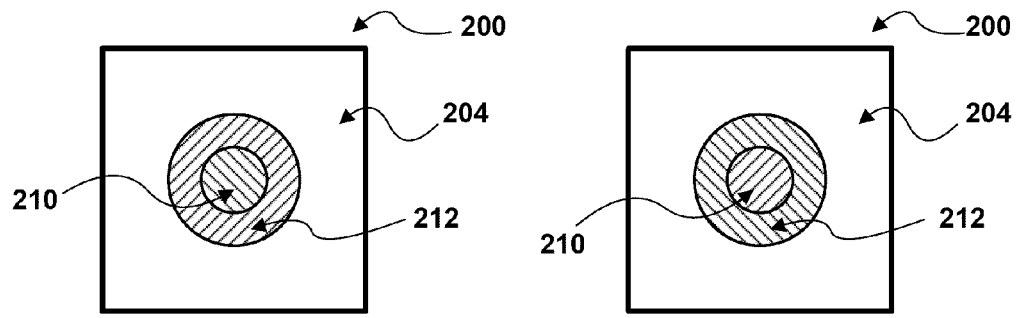
FIGURE 7
FIGURE 8

METHODS AND APPARATUS FOR HIGH SPEED SHORT DISTANCE OPTICAL COMMUNICATIONS USING MICRO LIGHT EMITTING DIODES

FIELD

The proposed solution relates to methods and apparatus for short distance high speed communications, and in particular to methods and apparatus employing light emitting diodes in short distance optical communication links.

BACKGROUND

Communications via optical fiber is mature technology. Electronic signals are converted to light signals and the light signals are coupled to an optical fiber which carries the optical signals over the optical link. At the other end of the optical fiber link a photo detector converts the light signal to an electronic signal completing the connection. The means of converting the electronic signal to an optical signal for example employs laser diodes for long distances at very high speed and light emitting diodes for medium distances at high speed.

The means to couple signals from light emitting diodes and laser diodes to optical fiber is well established in the art. U.S. Pat. No. 5,448,676 describes means to align a light emitting diode to the centre of the fiber, U.S. Pat. No. 5,631,992 stresses the use of a rod lens to couple the light source to the optical fiber, and U.S. patent publication number US 2007/0031089 describes means to couple light in a highly efficient method. U.S. Pat. No. 4,466,696 further describes similar coupling of laser diodes or light emitting diodes to optical fiber for the same means to form a communications link between two points. All these methods require mechanically matching the emission angle of the light emitting source to the acceptance angle of the optical fiber by employing intermediary optical equipment.

An ongoing challenge in coupling light emitting diodes to an optical fiber is the mismatch in the physical dimensions of the light emitting diode and the optical fiber. Nominally a multimode optical fiber has a diameter of 60 to 100 microns. A light emitting diode is at least three times larger, nominally 300 microns. Most of the light is lost unless refractive optics are used to converge the light into the optical fiber. In the case where laser diodes are used, which have a smaller emission angle and a small aperture, the cost of the laser diode and the emission angle pose the same problem as with a light emitting diode.

Light emitting diodes, though far lower in cost and suited for medium distances, are still not considered for short distances. This is due to cost constraints. Communications over long and medium distances can carry vast amounts of data at very high speed and the cost is easily amortized over the traffic. At short distances, the amount of data is much less and has to be amortized usually over a single user. One example of this short distance communications problem is referred to as the "last mile problem". It is feasible to bring optical fiber to a common point in a community and this is common practice. From this common point, connecting to each user via an optical cable link is prohibitive and limits the bandwidth which can be provided to each user. This "last mile" link is presently connected via copper conductors which have limited bandwidth.

There is a need for means of coupling light emitting diodes to an optical fiber, namely without the use of any secondary devices such as refractive optics and mechanical holding devices.

SUMMARY

The invention disclosed provides means to communicate at short distances at high speed via fiber optics making it practical to replace standard copper conductors with optical fiber. This can be a solution to the last mile problem in internet high speed communications.

The disclosure herein is particularly effective in providing means to establish short term communications at very low cost in comparison to prior art methods using large die light emitting diodes or laser diodes.

Micro light emitting diodes, which are substantially smaller than the diameter of multimode optical fiber, when bonded to one end of an optical fiber provide a coupler to couple light (signals) to an optical fiber for means of, namely for the purposes of, illumination or communication without the requirement of using a refractive element to bridge the mismatch between the emission angle of the light source to the acceptance angle of the optical fiber.

In accordance with one aspect of the proposed solution there is provided a coupler for an optical fiber (namely an optical fiber core) with its cladding with a micro light emitting diode placed at the surface of one end of the fiber. The light emitting diode is mounted on a substrate with contact pads with a conductor attached. The two conductors are for providing connections to the drive electronics that would then provide the electronic means of controlling the light emitting diode.

In another aspect of the proposed solution, there is provided a coupler for short distance high speed communications, the coupler comprising: an opening for receiving and securing an end of an optical fiber cable link, said opening defining a longitudinal axis of said coupler, said optical fiber having a diameter; a micro LED die having an emitter area substantially collinear with said longitudinal axis.

In accordance with another aspect of the proposed solution there is provided an optical link for short distance high speed communications comprising: at least one optical coupler; and an optical fiber having at least one end cleaved perpendicular to said axis, said end being inserted in said opening of said coupler, wherein said micro LED abuts a core of said optical fiber, said LED emitting area being having a diameter at least two times smaller than a diameter of a core of the optical fiber.

In accordance with a further aspect of the proposed solution there is provided a telecommunications network comprising a local signal distribution point and a plurality of optical links extending between said signal distribution point and a plurality of subscriber premises.

In accordance with a further aspect of the proposed solution there is provided a micro light emitting diode (LED) mounting assembly for short distance high speed communications over an optical fiber having a diameter, the assembly comprising: a substrate having a obverse face and a reverse face; and a micro LED die mounted on said obverse face, said LED having an emitting area less than three times smaller in diameter than the optical fiber diameter, wherein contact pads are provided on said reverse face for connection to conductors for driving said micro LED.

In accordance with yet another aspect of the proposed solution there is provided a short distance communications system for conveying at least one of signaling and data between a first and a second node, the system comprising: a first micro Light Emitting Diode (LED) assembly at said first node; an optical fiber between said first and said second node, said optical fiber having a first and a second end, each optical fiber end having a core area; and a second micro LED assembly at said second node, each said micro LED assembly having a corresponding micro LED having an emitter area, each micro LED assembly being mounted with corresponding micro LED emitter area orthogonal and abutting said corresponding end of said optical fiber, wherein said emitter are is at least three times smaller than said core area.

BRIEF DESCRIPTION OF DRAWINGS

The invention will be better understood by way of the following detailed description of embodiments of the invention with reference to the appended drawings, in which:

FIG. 3 is a schematic diagram illustrating a front view of a printed circuit board assembly in accordance with the proposed solution;

FIG. 4 is another schematic diagram illustrating a back view of the printed circuit board assembly in accordance the proposed solution;

FIG. 6 is a schematic diagram illustrating a spectral intensity variation plot for two sub-channels in accordance with the embodiment of the proposed solution;

FIG. 7 is a schematic diagram illustrating an upstream frequency filter pattern in accordance with the embodiment of the proposed solution; and FIG. 8 is a schematic diagram illustrating a downstream frequency filter pattern in accordance with the embodiment of the proposed solution, wherein similar features bear similar labels throughout the drawings. Reference to qualifiers such as "top" and "bottom" in the present specification is made solely with reference to the orientation of the drawings as presented in the application and do not imply any absolute spatial orientation.

DETAILED DESCRIPTION

Figure 1:
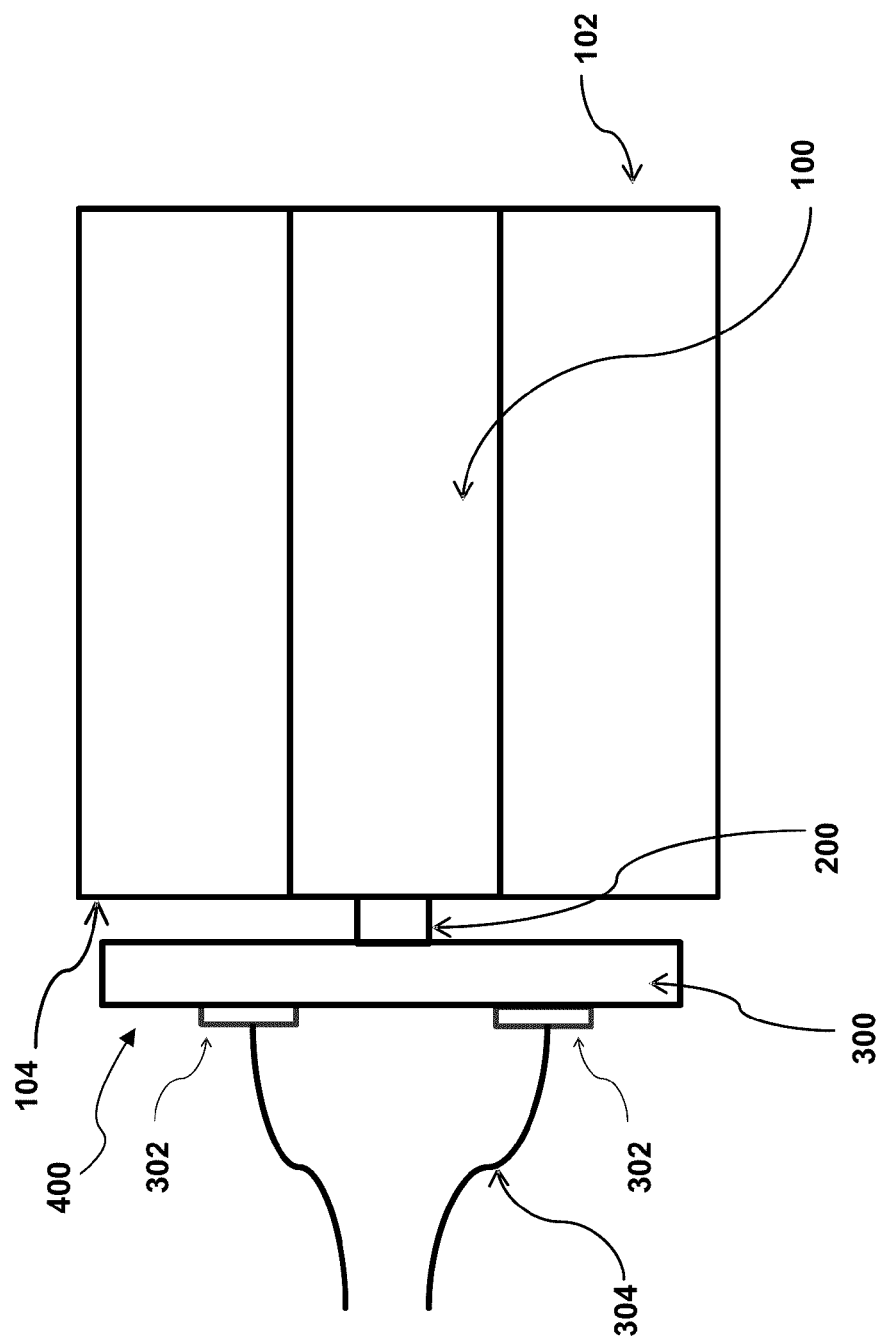
FIG. 1 is a schematic diagram illustrating butt coupling between a micro light emitting diode and an optical fiber in accordance with the proposed solution.

Recent advances in light emitting diode technology has made it possible to fabricate light emitting diode devices as small as a few microns in diameter and a few hundred microns or less from the surface. Such devices, known as micro LEDs, provide the means to couple a light source to an optical fiber directly, namely to provide optical signal coupling as illustrated in FIG. 1. Furthermore such devices can be fabricated with an integrated concave mirror or a micro lens providing an angle of emission that is narrower than that of standard light emitting diodes. FIG. 1 illustrates a multimode optical fiber 100 with its cladding 102 and a micro LED 200 placed at a cleaved surface 104 of one end of the optical fiber 100. Typically the optical fiber core 100 nominally has a 60 micron diameter whereas the micro LED 200 nominally has a 20 micron aperture. In the illustrated implementation, the micro LED 200 is mounted on a PCB carrier 300 substrate with contact pads 302 and illustrated with conductors 304 attached. The two conductors 304 illustrated are for providing connections to drive electronics (not shown) that would then provide electronic control of the micro LED 200. PCB carrier 300 substrate need not be circular.

Figure 2:
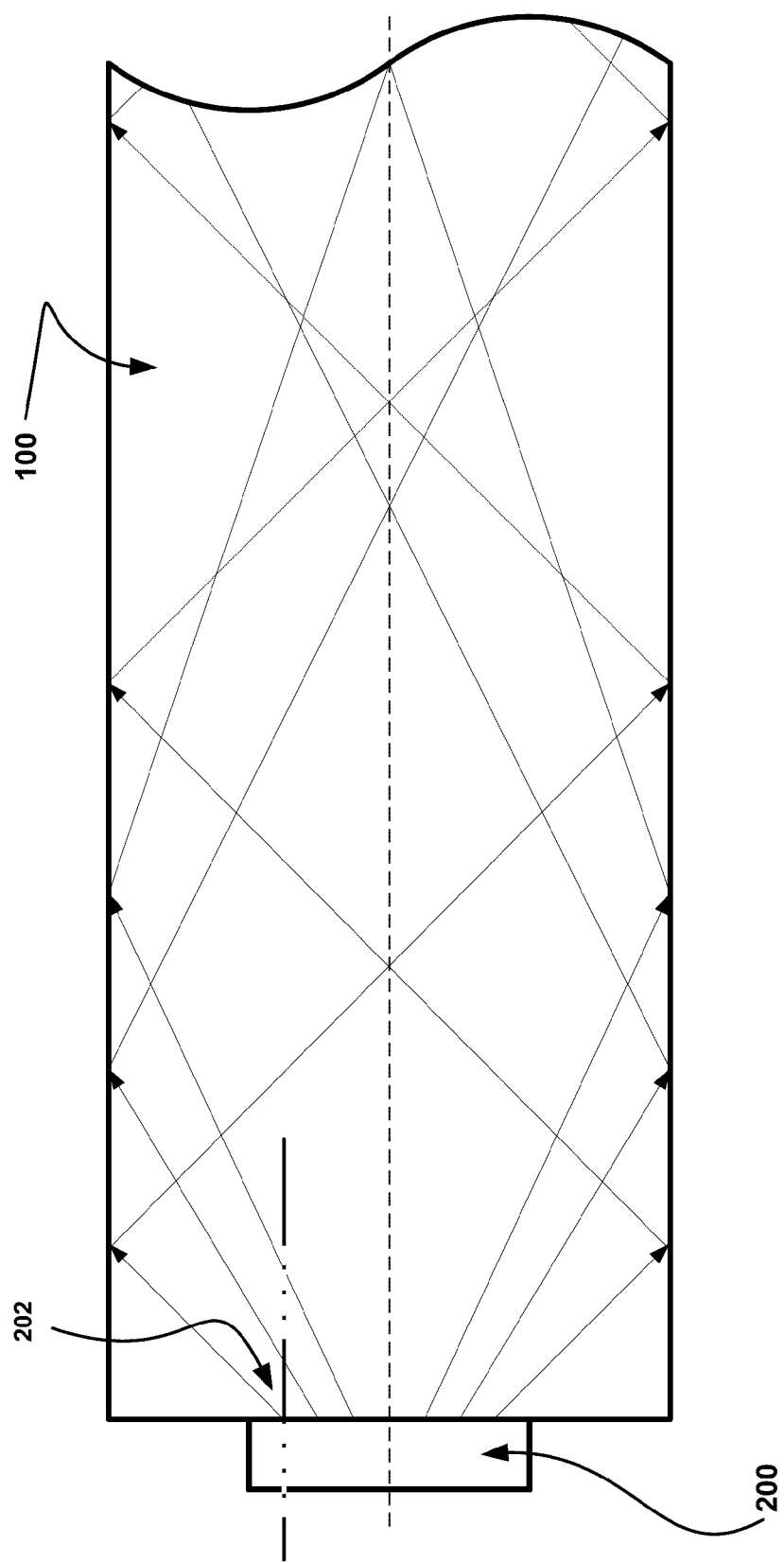
FIG. 2 is a schematic diagram illustrating total internal reflection within the acceptance angle of an optical fiber in accordance with the proposed solution.

Properties of such micro LED devices 200 lend themselves as means of providing light at an angle that is close to the acceptance angle of the optical fiber. Namely, such micro LED devices 200 lend themselves to emanating light at an angle 202 that is close to the acceptance angle of the optical fiber 100 as illustrated in FIG. 2. Light which enters the optical fiber 100 from such a small source (200) will expand at the angle of emission 202 which is lower than the angle of acceptance of the fiber 100 ensuring a highly efficient optical signal coupling.

In accordance with an embodiment of the proposed solution there is provided an assembly 400 (FIGS. 3 and 4) for mounting a micro LED 200 to an orthogonally cleaved surface 104 of an optical fiber 100 as illustrated in FIG. 1. A micro LED 200 smaller by three or more factors than an optical fiber 100 diameter allows butt coupling of the micro LED 200 to the optical fiber 100 without the need for optical and mechanical intermediary components. The diameter of the light emitting diode 200 is 20 microns. The diameter of the multimode optical fiber core 100 is 60 microns. For certainty, these dimensions are examples only and the principle is that the light source is many factors smaller than the optical fiber diameter.

The light signal emitted from the micro LED 200 enters the orthogonally cleaved surface 104 without any hindrance or without passing through any other optical device. The light expands internally in the optical fiber 100 and a substantial portion of the light travels longitudinally, as illustrated in FIG. 2, through the optical fiber 100 to the opposite end of the optical fiber 100 where a photo detector 212 receives the light signal and converts the same to an electrical signal.

In accordance with a preferred implementation of the proposed solution, the mounting assembly 400 includes a micro LED die 204, without limiting the invention made of GaAs, mounted on the small (PCB) substrate 300 with a driver and impedance matching components 500 preferably on the rear of the substrate 300 opposite the micro LED die 204. The conductors 304 are attached to the mounting assembly 400 to connect to an external signal. In another implementation the micro LED substrate 204 would also include driver electronics (500) such that only an external digital signal is required to modulate and drive the micro LED 200.

Figure 5A:
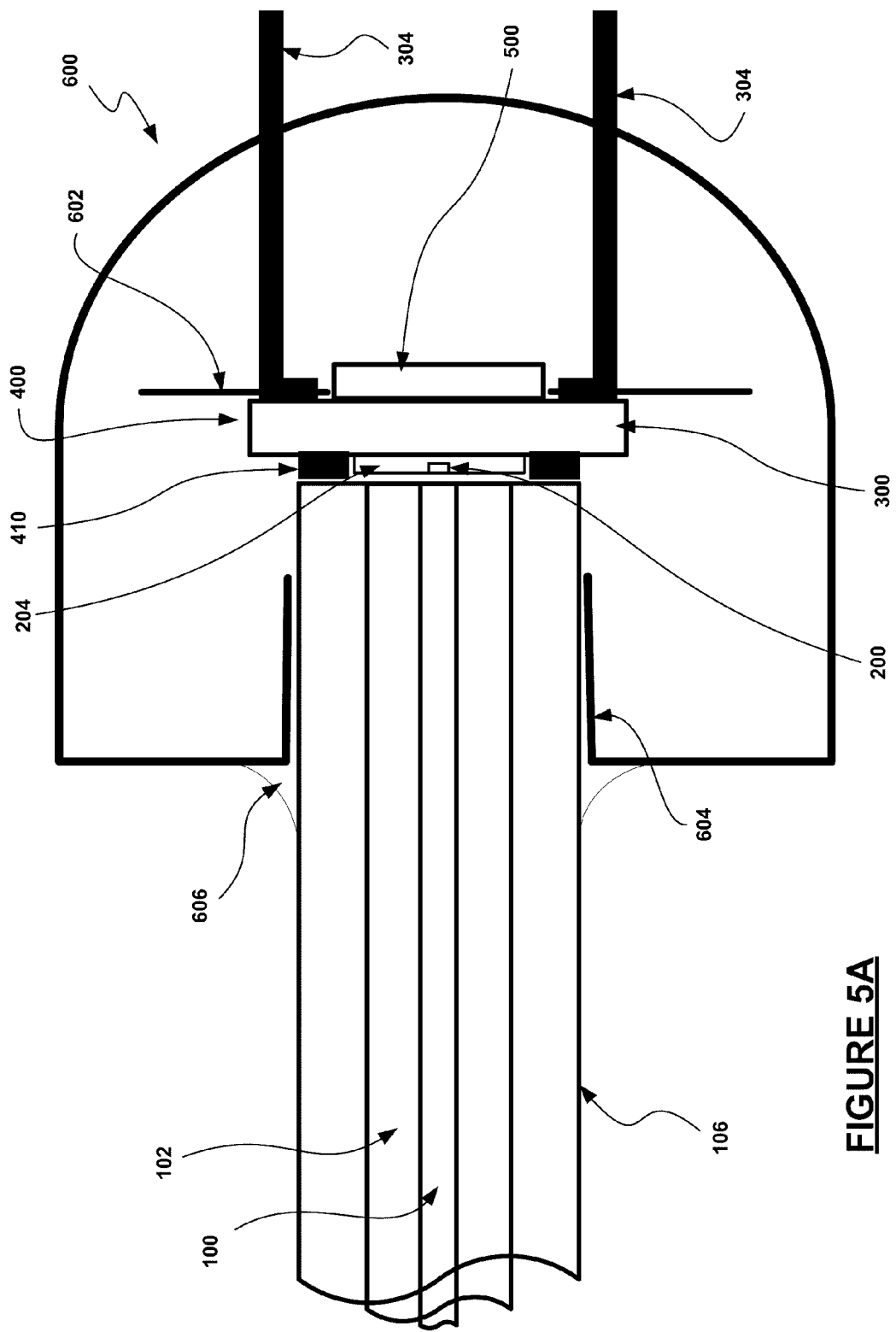
FIG. 5A is a schematic diagram illustrating a socket coupled to an optical fiber in accordance with an embodiment of the proposed solution.

For practical purposes in the field where it would not be possible to attach the micro LED 204, being very small, to the optical fiber 100, it is preferable to provide the micro LED assembly 400 mounted in a socket 600 (or carrier). As illustrated in FIG. 5 (not to scale) the socket 600 includes a seat 602 for the micro LED assembly 400 and an opening 604 to insert a pre-cleaved optical fiber 100 substantially collinear with the micro LED 204. The insertion is limited by an appropriate spacer 410. The material used to make socket 600 has the property of being flexible to accommodate variation in the optical fiber jacket 106 diameter while having sufficient strength to maintain the integrity of the coupling. After inserting the optical fiber 100 in the opening it is envisioned that a fast curing epoxy 606 can be used to secure the coupling.

Figure 5B:
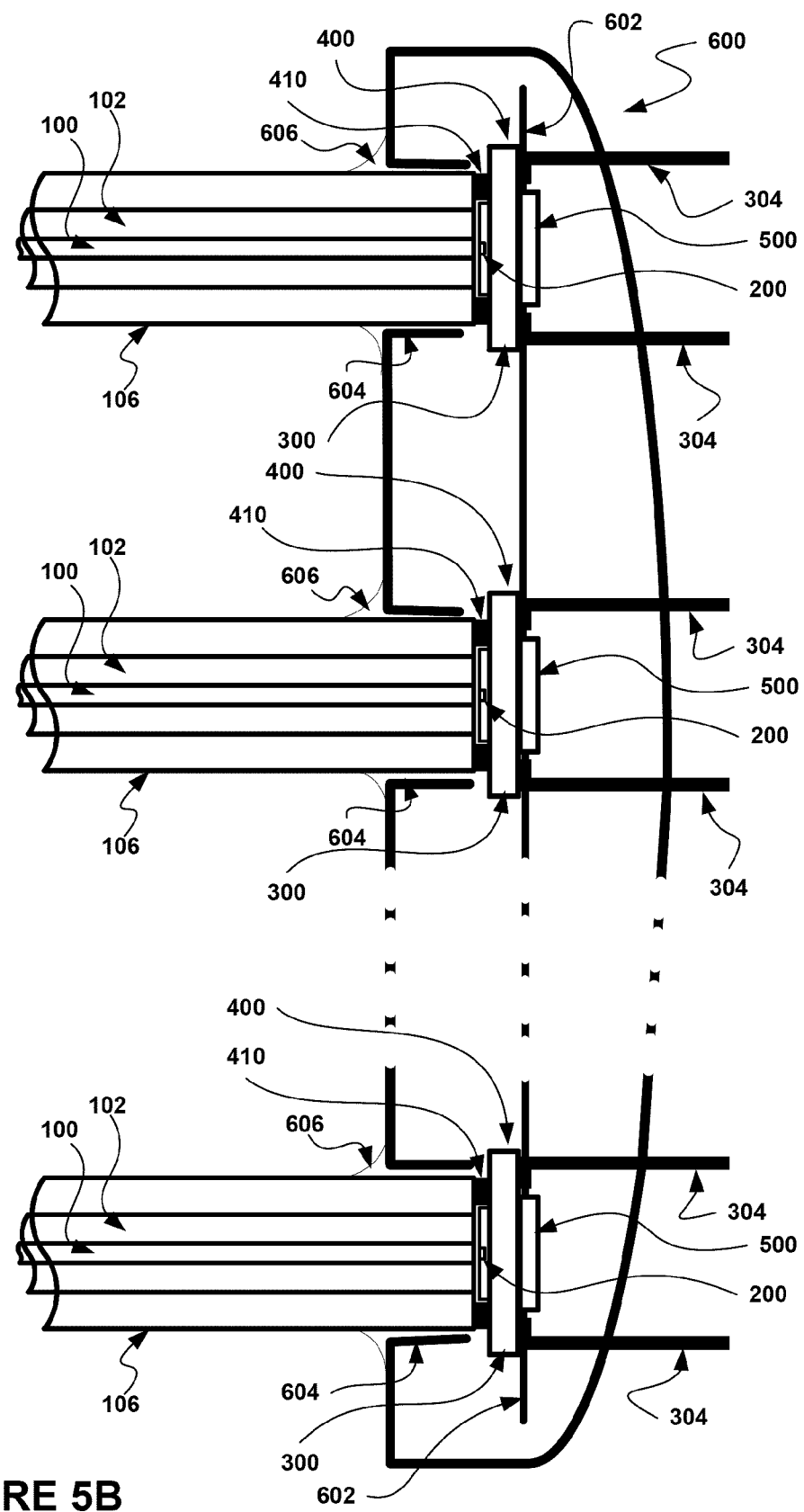
FIG. 5B is a schematic diagram illustrating a carrier for coupling a number of optical fibers in accordance with the embodiment of the proposed solution.
Figure 5C:
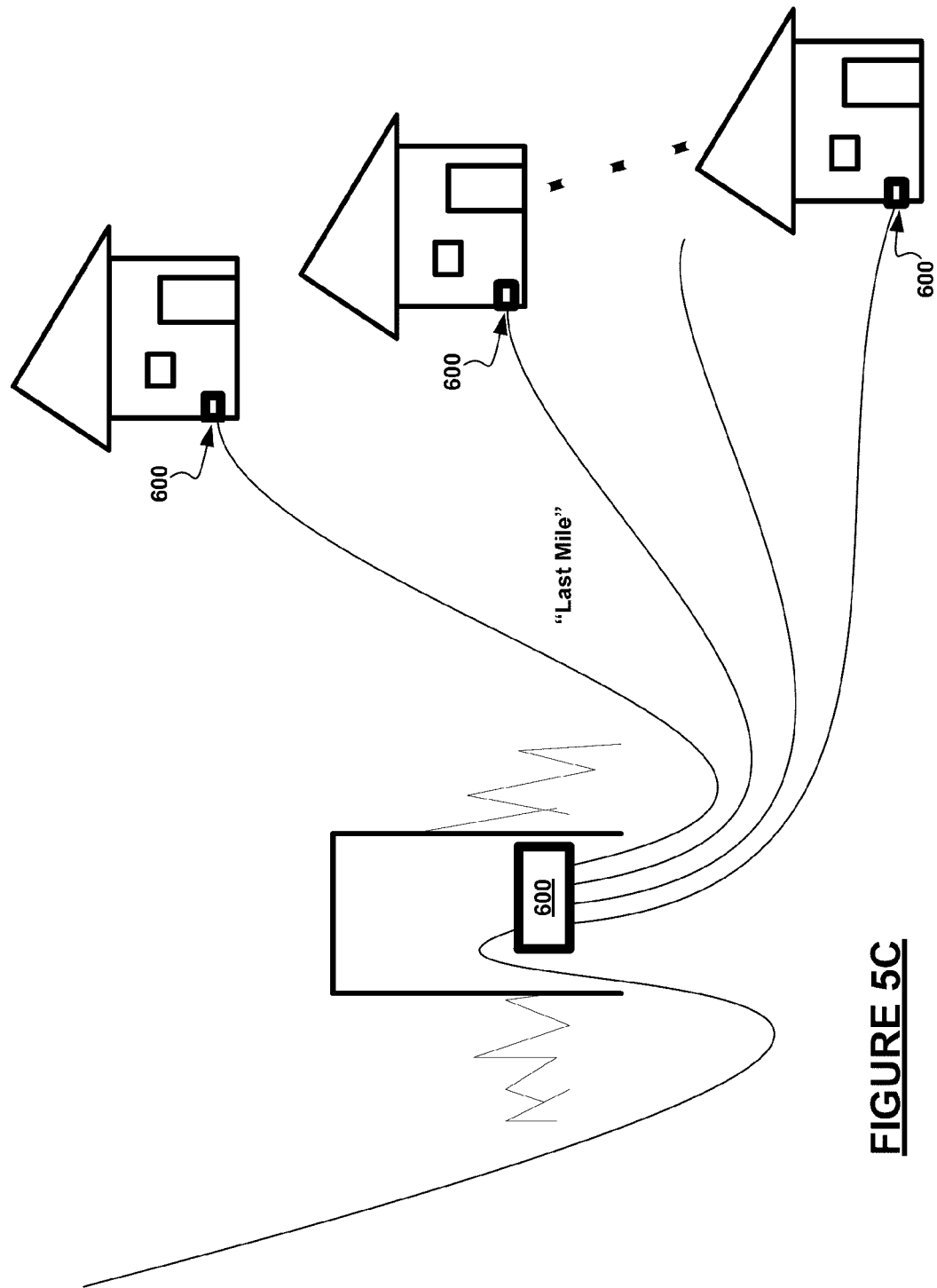
FIG. 5C is a schematic diagram illustrating a "last mile" proposed solution.

In accordance with another implementation of the proposed solution a number of micro LED assemblies 400 are mounted in a carrier 600 as illustrated in FIG. 5B. Such a multi assembly carrier 600 is particularly adapted for a signal distribution point in a neighborhood as illustrated in FIG. 5C.

The number of conductors 304 is determined by the functions of the PCB substrate, having for example simplex or duplex transmission capabilities.

Optical fiber communications standards have been established for operation at 1300 nm with the wavelength band extending from 1260 to 1360 nm (FIG. 6).

Today's technology allows design of light emitting diodes whose emission is sufficiently narrow so that two different wavelength sub-bands can be accommodated within the standards band as illustrated in FIG. 6. In accordance with an implementation of the proposed solution, one micro LED is constructed to be centered at $w_1=1280$ nm and the other at $w_2=1320$ nm for upstream and downstream signaling sub-channels. The invention is not limited to a particular association of sub-channels to upstream or downstream signaling nor limited to a particular communications channel wavelength.

In accordance with the proposed solution a GaAs device can be constructed where the central area is a light emitter 210 (micro LED) and the surrounding annular area is a photo detector 212 (photodiode). If the emission area 210 has diameter d, the emission area is $\pi(d/2)^2$. If the diameter of the photo detector 212 is D, the area of the photo detector 212 is $\pi((D/2)^2-(d/2)^2)$. For d=20 microns and D=100 microns, the area of the detector 212 is 24 times larger than that of the emitter 210. This reduces the need amplification required for detecting the attenuated signal coming in from the opposite end of the optical fiber 100.

In accordance with a preferred implementation, to make the photo detectors 212 react to only the optical signal coming from the opposite end of the optical fiber 100, each detector 212 can employ a notch filter to reject signals from the emitter 210 that the detector 212 is part of. With reference to FIG. 7 the emitter 210 emitting $w_1$ will have a notch filter for $w_2$ on the detector 212 and with reference to FIG. 8 the emitter 210 emitting at $w_2$ will have a notch filter at $w_1$ over the corresponding surrounding detector 212. The notch filter can include a film or a layer. Color coding can be employed to differentiate between the two assemblies 400 containing the two devices.

Alternatively the means disclosed herein, namely the apparatus disclosed herein, also enables short distance communications for command and control for systems such as automobiles and aircraft as well as any simple or complex organization of subsystems that require fast exchange of information.

While the invention has been shown and described with referenced to preferred embodiments thereof, it will be recognized by those skilled in the art that various changes in form and detail may be made therein without departing from the spirit and scope of the invention as defined by the appended claims.

I claim:

1. An optical link for short distance high speed communications comprising:
   at least one optical coupler comprising:
      an opening for receiving and securing an end of an optical fiber, said opening defining a longitudinal axis of said coupler, said optical fiber having a diameter; and
      a micro LED die having an emitter area substantially collinear with said longitudinal axis; and
   an optical fiber having at least one end cleaved perpendicular to said axis, said end being inserted in said opening of said coupler, wherein said micro LED abuts a core of said optical fiber, said LED emitting area having a diameter at least two times smaller than a diameter of a core of the optical fiber.

2. An optical link as claimed in claim 1, comprising a first optical coupler and a second optical coupler, said optical fiber having a first and a second end cleaved perpendicular to said axis, each optical fiber end being inserted in a corresponding optical coupler, each said central micro LED emitter area of an optical coupler at each of the optical fiber being configured to emit in a wavelength band to which said annular photo detector area of the opposite end of the optical fiber is sensitive to.

3. An optical link as claimed in claim 2, wherein each optical coupler comprises a notch filter over a photo detector area of said optical coupler, said notch filter being sensitive to said emission wavelength band of said micro LED emission area of said coupler at the corresponding opposite end of said optical fiber.

4. An optical link as claimed in claim 1, wherein said optical fiber is multimode optical fiber.

5. A telecommunications network comprising a local signal distribution point and a plurality of optical links extending between said signal distribution point and a plurality of subscriber premises, wherein said optical links are for short distance high speed communications comprising:
   at least one optical coupler comprising:
      an opening for receiving and securing an end of an optical fiber cable link, said opening defining a longitudinal axis of said coupler, said optical fiber having a diameter; and
      a micro LED die having an emitter area substantially collinear with said longitudinal axis; and
   an optical fiber having at least one end cleaved perpendicular to said axis, said end being inserted in said opening of said coupler, wherein said micro LED abuts a core of said optical fiber, said LED emitting area having a diameter at least two times smaller than a diameter of a core of the optical fiber.

6. A micro light emitting diode (LED) mounting assembly for short distance high speed communications over an optical fiber having a diameter, the assembly comprising:
   a substrate having a obverse face and a reverse face; and
   a micro LED die mounted on said obverse face, said LED having an emitting area less than three times smaller in diameter than the optical fiber diameter,
   wherein contact pads are provided on said reverse face for connection to conductors for driving said micro LED.

7. An assembly as claimed in claim 6, wherein said micro LED emitter area is centered with respect to the substrate.

8. An assembly as claimed in claim 6, wherein said substrate is substantially circular.

9. An assembly as claimed in claim 6, said assembly comprising an electronics package configured to drive said micro LED and to match electrical signal impedance for electrical signals exchanged with said electronics package.

10. An assembly as claimed in claim 6, wherein said micro LED die further comprises an annular photo detector about said micro LED emission area.

11. An assembly as claimed in claim 6, said assembly comprising a notch filter over said annular photo detector.

12. An assembly as claimed in claim 11 wherein said notch filter is one of a film and a layer.

13. An assembly as claimed in claim 6, wherein said substrate further comprises spacer elements for abutting against a cleaved end of said optical fiber.

14. A short distance communications system for conveying at least one of signaling and data between a first and a second node, the system comprising:
- a first micro Light Emitting Diode (LED) assembly at said first node;
- an optical fiber between said first and said second node, said optical fiber having a first and a second end, each optical fiber end having a core area; and
- a second micro LED assembly at said second node, each said micro LED assembly having a corresponding micro LED having an emitter area, each micro LED assembly being mounted with corresponding micro LED emitter area orthogonal and abutting said corresponding end of said optical fiber, wherein said emitter are is at least three times smaller than said core area.

15. A system as claimed in claim 14, wherein said optical fiber is multimode optical fiber.

16. A system as claimed in claim 14, wherein each said micro LED assembly includes a substrate on which said corresponding micro LED is mounted, said substrate having contact pads for providing connections to micro LED drive electronics.

17. A system as claimed in claim 16, wherein each micro LED assembly further comprises a micro LED driver electronics for conveying an external electrical signal.

* * * * *